United States Patent [19]
Abraham

[11] Patent Number: 5,980,768
[45] Date of Patent: Nov. 9, 1999

[54] METHODS AND APPARATUS FOR REMOVING PHOTORESIST MASK DEFECTS IN A PLASMA REACTOR

[75] Inventor: Susan C. Abraham, San Jose, Calif.

[73] Assignee: Lam Research Corp., Fremont, Calif.

[21] Appl. No.: 08/813,778

[22] Filed: Mar. 7, 1997

[51] Int. Cl.⁶ ................................................. H01L 21/00
[52] U.S. Cl. ............................ 216/67; 216/72; 438/710
[58] Field of Search .................................. 438/710, 715, 438/717, 725; 156/345; 216/16, 17, 64, 67

[56] References Cited

U.S. PATENT DOCUMENTS

| | | | |
|---|---|---|---|
| 4,267,012 | 5/1981 | Pierce et al. | 156/643 |
| 4,740,485 | 4/1988 | Sharpe-Geisler | 437/246 |
| 4,782,009 | 11/1988 | Bolon et al. . | |
| 4,878,994 | 11/1989 | Jucka et al. | 156/643 |
| 4,980,018 | 12/1990 | Mu et al. | 156/643 |
| 5,252,181 | 10/1993 | Dutartre et al. . | |
| 5,256,245 | 10/1993 | Keller et al. | 156/643 |
| 5,320,707 | 6/1994 | Kanekiyo et al. | 156/665 |
| 5,326,427 | 7/1994 | Jerbic | 156/643 |
| 5,356,478 | 10/1994 | Chen et al. | 134/1 |
| 5,397,684 | 3/1995 | Hogan et al. . | |
| 5,411,631 | 5/1995 | Hori et al. | 216/72 |
| 5,429,070 | 7/1995 | Campbell et al. | 118/723 |
| 5,496,762 | 3/1996 | Sandhu et al. | 437/60 |
| 5,522,520 | 6/1996 | Kawamoto | 216/62 |
| 5,540,812 | 7/1996 | Kadomura | 156/652.1 |
| 5,545,289 | 8/1996 | Chen et al. | 156/643.1 |
| 5,562,801 | 10/1996 | Nulty | 156/643.1 |
| 5,609,775 | 3/1997 | Liu | 216/77 |
| 5,620,615 | 4/1997 | Keller | 438/720 |

FOREIGN PATENT DOCUMENTS

| | | |
|---|---|---|
| 57 157525 | 9/1982 | European Pat. Off. . |
| 489 407 A2 | 6/1992 | European Pat. Off. ......... H01L 37/32 |
| 622 477 A1 | 11/1994 | European Pat. Off. .......... C23F 4/00 |

OTHER PUBLICATIONS

Riley, P; Holbert, R; Kavari, R; and Lujan, L., "Composite metal etching for submicron integrated circuits" Extented Abstracts, vol. 93, No. 1, May 1993, Princeton, NJ.

Riley, P; Peng, S; and Fang, L., "Plasma Etching of Aluminum for ULSI Circuits", Solid State Technology, vol. 36, No. 2, Feb. 1993, Washington.

Gottscho, R.S; Jurgensen, C.W; Vitkavage, D.J., "Microscopic Uniformity in Plasma Etching", Journal of Vacuum Science and Technology B, Microelectronic Process and Phenomena, vol. 10, No. 5, Oct. 1992, pp. 2133–2147.

Patent Abstracts of Japan, vol. 95, No. 6, Jul. 31, 1995.

T.H. Ahn; S.W. Nam; K.J. Min; and Chung, C., "Effect of Residual Gases on Residue Formation during Tungsten/TiN/Ti Etching Using $SF_6$ and $Cl_2$ Gas Chemistry," Jpn. J. Appl. Phys. vol. 33 (1994) pp. L918–L920, Part 2, No. 7A, Jul. 1, 1994.

*Primary Examiner*—Bruce Breneman
*Assistant Examiner*—Allan Olsen
*Attorney, Agent, or Firm*—Beyer & Weaver, LLP

[57] ABSTRACT

In a plasma reactor, a method for removing photoresist mask defects, which includes introducing a substrate having thereon a photoresist mask into the plasma reactor. The method further includes flowing into the plasma reactor an etchant source gas comprising nitrogen. The etchant source gas is substantially oxidant-free. The method also includes removing the photoresist mask defects employing a plasma struck with the etchant source gas.

30 Claims, 5 Drawing Sheets ically idealized cross-sectional view of layer stack 20 of FIG. 1 after the

METHODS AND APPARATUS FOR REMOVING PHOTORESIST MASK DEFECTS IN A PLASMA REACTOR

BACKGROUND OF THE INVENTION

This invention relates to the fabrication of semiconductor integrated circuits ICs). More particularly, the present invention relates to methods and apparatus for efficiently removing photoresist mask defects on a substrate and/or etching through an organic-based antireflective coating layer.

In semiconductor fabrication, devices such as component transistors may be formed on a substrate, e.g., a semiconductor wafer or a glass panel. Above the substrate, there may be disposed a plurality of layers from which the devices may be fabricated. Metallic interconnect lines, which may be etched from a metal layer disposed above the substrate, may then be employed to couple the devices together to form the desired circuit. To facilitate discussion, FIG. 1 illustrates a cross-sectional view of a layer stack 20, representing the layers of an exemplar semiconductor IC. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

At the bottom of layer stack 20, there is shown a substrate 100. An oxide layer 102, typically comprising $SiO_2$, may be formed above substrate 100. A barrier layer 104, typically formed of a titanium-containing layer such as Ti, TiW, TiN or other suitable barrier materials, may be disposed between oxide layer 102 and a subsequently deposited metal layer 106. Barrier layer 104, when provided, may function to prevent the diffusion of silicon atoms from oxide layer 102 into the metal layer. Metal layer 106 typically comprises, for example, copper, aluminum or one of the known aluminum alloys such as Al—Cu, Al—Si or Al—Cu—Si.

The remaining layers of FIG. 1, i.e., an antireflective coating (ARC) layers 108 and 110 and an overlaying photoresist (PR) layer 112, may then be formed atop metal layer 106. The ARC layer 108, typically comprising another titanium-containing layer such as Ti, TiN or TiW, may help prevent light (e.g., from the lithography step that patterns the photoresist) from being reflected and scattered off the surface of the metal layer 106 and may, in some cases, inhibit hillock growth. For some substrates, e.g., those being scaled with narrow design rules such as 0.25 microns or below, layer stack 20 may further include an optional layer of organic-based antireflective material (e.g., polyamide-based antireflective material), which is typically disposed above the layer of conventional (e.g., Ti, TiN, or TiW) antireflective material. The optional organic-based antireflective material is depicted in FIG. 1 as organic ARC layer 110.

Photoresist layer 112 represents a layer of conventional photoresist material, which may be patterned for etching, e.g., through exposure to ultra-violet rays. The layers of layer stack 20 are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including the metal layer, e.g., metal layer 106, is etched using a suitable photoresist technique. By way of example, one such photoresist technique involves the patterning of photoresist layer 112 by exposing the photoresist material in a contact or stepper lithography system, and the development of the photoresist material to form a mask to facilitate subsequent etching. Using appropriate etchants, the areas of the metal layer that are unprotected by the mask may then be etched away, leaving behind metal interconnect lines or features. For illustration purposes, FIG. 2 shows a somewhat idealized cross-sectional view of layer stack 20 of FIG. 1 after the main etching step, i.e., metal etching, is completed. In this example, feature 202, representing the unetched portion through layers 110, 108, 106, and 104, forms an interconnect line on substrate 100.

To achieve greater circuit density, modern IC circuits are scaled with increasingly narrower design rules. As a result, the feature sizes, i.e., the width of the interconnect lines or the spacings (e.g., trenches) between adjacent interconnect lines, have steadily decreased. By way of example, while a line width of approximately 0.8 microns ($\mu$m) may be considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to achieve a defect-free photoresist mask for etching the underlying layers of the substrate layer stack. By way of example, as the critical dimension (i.e., width) of the photoresist mask features shrinks, it may not be possible to remove all the photoresist material in areas where photoresist material is undesired, i.e., in the trenches of the photoresist mask. The remaining layers or blocks of unwanted photoresist material at the bottom of the trenches of the photoresist mask represent defects in the photoresist mask since they affect subsequent etching processes.

By way of example, FIG. 3 illustrates an example of a layer stack 300 whose photoresist mask suffers from defects. In FIG. 3, layers 100, 102, 104, 106, 108, and 110 are substantially similar to layers having like reference numerals in FIG. 1. Photoresist mask 112 which has been processed in accordance with a conventional photoresist process, suffers from scumming layer-type defect in trench 302 and sloped foot-type defect in trench 304.

The scumming layer-type defect may be caused by the incomplete removal of the photoresist material in trench 302 such that a thin layer of photoresist remains at the bottom of the trench. Scumming layer-type defects, which may frequently occur in narrow (e.g., below 0.35 micron wide) and high aspect ratio (e.g., above 3:1) trenches, affect, among others, the uniformity of the subsequent etch process (e.g., metal etch) since the underlying layers in trench 302 are undesirably shielded from the subsequent etch step. In severe cases, there may be a loss of control of over the critical dimension of the mask since the subsequent etch step may need to be extended to clear the defects, to the detriment of the protective mask features.

The sloped foot-type defect may also be caused by the incomplete removal of photoresist material in trench 304 such that there exists a sloped foot attached to the bottom of the photoresist mask feature. Sloped foot-type defects may result in, for example, a change in the critical dimension of the etched feature (e.g., the width d1 of feature 202 in the example of FIG. 2) since the blocks of unwanted photoresist material may exert a "shadowing" or shielding effect to modify the evolution of the etch profile, e.g., narrowing the underlying etched feature. Further, this may also affect microloading and/or aspect ratio dependent etching issues. Changes in the critical dimension may result in reduced circuit yield since, for example, the critical dimension of the resultant etched feature may be unduly narrow, leading to its failure in manufacturing or in use (e.g., when current is applied).

In the prior art, photoresist mask defects are remedied by performing either an ash-type process or a bombardment-type process on the photoresist mask. Bombardment-type processes subject the substrate to physical bombardment by the etchant species. In one example, bombardment is performed in a transformer-coupled plasma processing chamber. At high bottom electrode power, the etchant species are accelerated toward the surface of the substrate to essentially sputter away the defect. Bombardment may also be increased by, for example, increasing the flow of etchant and/or reducing the chamber pressure. There are, however, disadvantages associated with bombardment-type processes. For example, it is recognized that bombardment-type processes may erode away the desirable photoresist mask features at the same time it erodes away the unwanted photoresist material, e.g., the scumming layer or the sloped foot of FIG. 3. Accordingly, bombardment-type processes tend to unduly reduce the ability of the photoresist mask, after bombardment, to protect the underlying layers from undesirable etching in subsequent etching steps.

Ash-type processes subject the substrate to oxidant-based chemistries, i.e., those containing $O_2$, which react with and erodes away photoresist. There are, however, disadvantages associated with ash-type processes as well. For example, it is recognized that ash-type processes may also erode away the desirable photoresist mask features at the same time they erode away the unwanted photoresist material, thereby reducing the ability of the photoresist mask, after ashing, to protect the underlying layers from undesirable etching in subsequent etching steps.

Ash-type processes are also typically performed in a reactor module that is different from the module employed for metal etching. This is because the oxygen-based chemistries of the ash process, if employed in the metal etch reactor, may react with certain chemistries typically employed for metal etching, e.g., $BCl_3$, and form an undue amount of polymer particles in the reactor chamber. In addition to increasing particle contamination, the increase in the amount of formed polymer particles also necessitates more frequent cleaning of the chamber, which increases cost. The use of a different reactor chamber to perform ash-type processes also introduces one or more additional steps into the fabrication process, thereby increasing the amount of time required to process a substrate, and reducing substrate throughput. For example, after a substrate has been processed via a conventional photoresist process, it may be necessary to employ a separate chamber to perform an ash-type process on the substrate to remedy photoresist mask defects, remove the substrate therefrom after ashing, and clean particles from the substrate (e.g., by washing) prior to introducing the substrate into a metal etch reactor for the actual etching of the underlying metal layer.

Ash-type processes and/or bombardment-type processes may also be employed in the prior art to break through the organic-based ARC layer, e.g., ARC layer 110 of FIG. 3, prior to performing the main etch. The use of ash-type processes and/or bombardment-type processes for this purpose involve disadvantages as well, e.g., introducing contamination into the metal etch chamber, negatively affecting etch uniformity, reducing substrate throughput and/or increasing reactor chamber maintenance.

In view of the foregoing, there are desired improved methods and apparatus for efficiently removing photoresist mask defects on a substrate and/or etching through an organic-based antireflective coating layer.

SUMMARY OF THE INVENTION

The present invention relates, in one embodiment, to a method in a plasma reactor for removing photoresist mask defects, which includes introducing a substrate having thereon a photoresist mask into the plasma reactor. The method further includes flowing into the plasma reactor an etchant source gas comprising nitrogen. The etchant source gas is substantially oxidant-free. The method also includes removing the photoresist mask defects employing a plasma struck with the etchant source gas.

In another embodiment, the present invention relates to a method, in a plasma reactor, for breaking through an organic-based antireflective coating layer. The method includes introducing a substrate having thereon the organic-based antireflective coating layer into the plasma reactor. The method further includes flowing into the plasma reactor an etchant source gas consisting essentially of nitrogen. The method also includes etching through a thickness of the organic-based antireflective coating layer employing a plasma struck with the etchant source gas.

In yet another embodiment, the present invention relates to a method, in a plasma reactor, for performing a combined photoresist mask defect removal and breakthrough etching through a polyamide-based antireflective coating layer. The method includes placing a substrate on a chuck in the plasma reactor. The substrate has thereon a photoresist mask and an underlying layer of polyamide-based antireflective coating layer. The method further includes flowing into the plasma reactor an etchant source gas that comprises nitrogen and that is substantially oxidant-free. Additionally, the method includes etching away both the photoresist mask defect and through the polyamide-based antireflective coating layer with a plasma struck from the etchant source gas.

These and other features of the present invention will be described in more detail below in the detailed description of the invention and in conjunction with the following figures.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
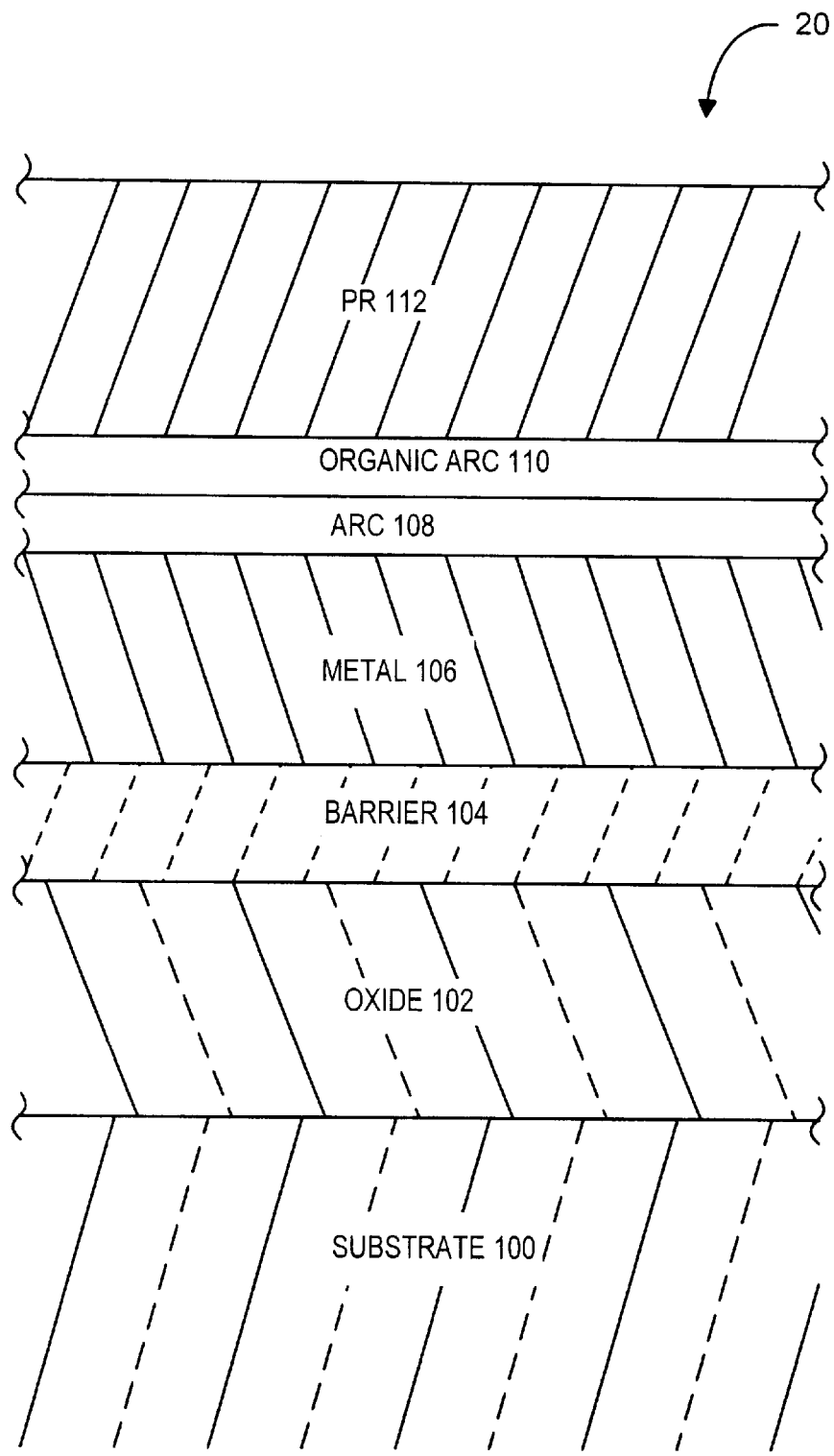
FIG. 1 illustrates a cross-sectional view of a layer stack, representing the layers of an exemplar semiconductor IC to facilitate discussion.
Figure 2:
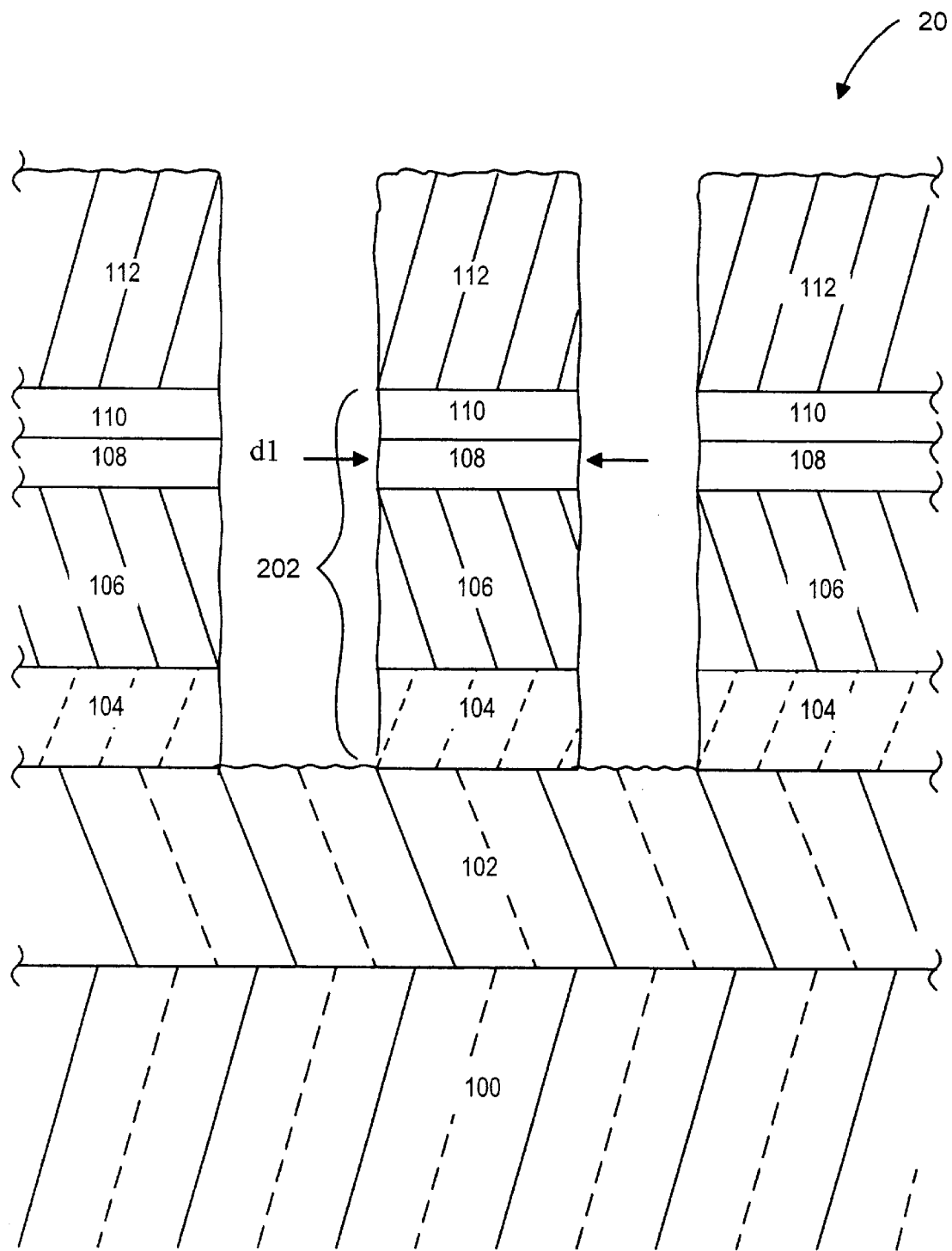
FIG. 2 depicts a somewhat idealized cross-sectional view of the layer stack of FIG. 1 after the metal etching step is completed.
Figure 3:
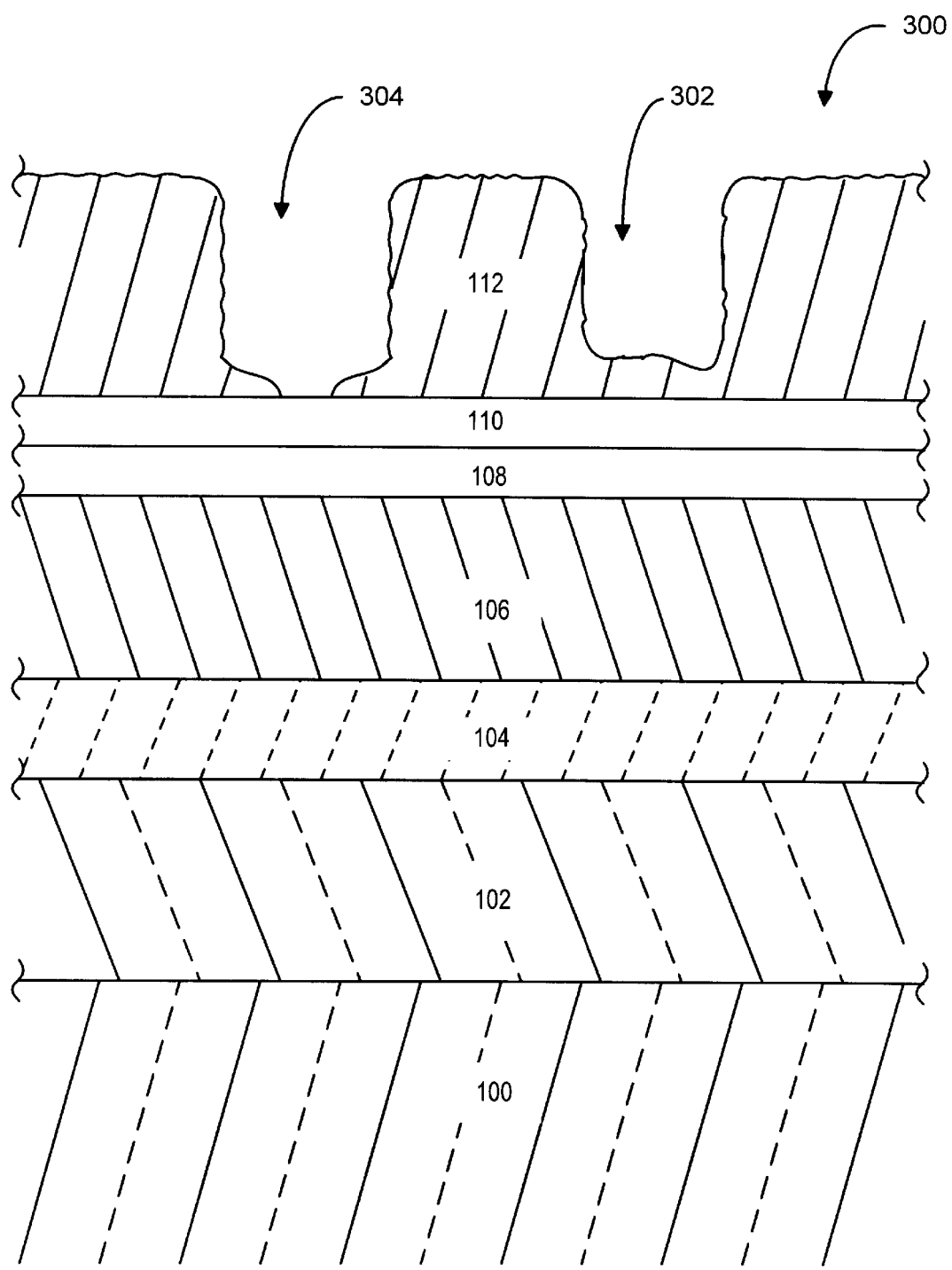
FIG. 3 illustrates an example of a substrate whose photoresist mask suffers from defects.

In one embodiment, the above-discussed photoresist mask defects are removed through an inventive $N_2$ etching technique that employs $N_2$ as the primary etchant source gas in a plasma processing chamber. After the substrate containing the photoresist mask is introduced into the plasma processing chamber, the inventive $N_2$ etching process is performed for a predefined period of time to facilitate the removal of the scumming layer defects and/or sloped foot photoresist mask defects. Thereafter, the main etching step, i.e., the etching step for which the photoresist mask is designed (such as metal etching in the exemplary layer stack of FIGS. 1–3), is performed to obtain the desired etched feature. Preferably, the main etching step is executed in the same plasma processing chamber employed for the inventive $N_2$ etching process. Advantageously, the number of additional processing and/or substrate moving steps is minimized, leading to improved substrate throughput.

In another embodiment, the inventive $N_2$ etching process is employed as the etching step for the organic-based ARC layer (e.g., polyamide-based ARC layer) prior to performing the main etching step. In accordance with this embodiment, the inventive $N_2$ etching process is performed for a predefined period of time prior to performing the main etching step. If the substrate also requires photoresist mask defect removal, the inventive $N_2$ etching process may be extended to both remove the photoresist mask defects and to breakthrough the organic-based ARC layer prior to performing the main etching step. As mentioned earlier, the main etching step is preferably, in one embodiment, executed in the same plasma processing chamber employed for the inventive $N_2$ etching process in order to minimize the number of additional processing and/or substrate moving steps.

In accordance with one aspect of the present invention, $N_2$, which has typically been regarded as an inert purging gas or cycling gas, or as a polymer-enhancing additive, is advantageously employed as an etchant source gas. In a nonobvious manner, the use of inexpensive and nontoxic $N_2$, which is heretofore believed to be substantially inert and widely available in substrate processing facilities and/or with the substrate processing tools (albeit for entirely different purposes), as the etchant chemical advantageously facilitates the removal of photoresist mask defects and/or organic-based ARC layer material with little detrimental effects on subsequent processing steps and/or minimal contamination to the plasma processing chamber. In comparison to prior art ash-type processes, e.g., those involving an oxidant-based etchant source gas, fewer contaminating particles are formed by the inventive $N_2$ etching process, thereby permitting, in one embodiment, the same chamber to be employed both in photoresist mask defect removal and/or organic-based ARC layer breakthrough. Accordingly, the number of different chamber reactors employed and/or the number of additional processing steps required may be minimized.

Further, it is observed that the inventive $N_2$ etching process results in less damage to the protective photoresist features, i.e., the photoresist features overlying positions of the underlying layers in which etching by the main etching step is not desired. Accordingly, the invention results in a well-defined and robust photoresist mask on the substrate after photoresist mask defect removal and/or organic-based ARC layer breakthrough is performed.

In accordance with one aspect of the present invention, the inventive photoresist mask defect removal and/or organic-based ARC etch technique may be performed in any of the known plasma processing apparatuses, including those adapted for dry etching, plasma etching, reactive ion etching (RIE), magnetically enhanced reactive ion etching (MERIE), electron cyclotron resonance (ECR), or the like. To further elaborate, in a typical plasma processing chamber adapted for dry etching, the wafer is treated with plasma. The chamber includes an inlet port through which process etchant source gases are supplied to the chamber interior. A suitable RF energy source is applied to electrodes associated with the chamber to induce a plasma from the etchant source gases. The energy itself may be coupled inductively or capacitively to sustain the plasma, as is known. Species are then formed from the etchant source gas to react with the layer stack and etch away at the plasma-contacting regions of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found that the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and transformer coupled plasma (whether or not planar). ECR and TCP™ brand inductively coupled plasma processing systems, among others, are readily available commercially. TCP™ TCP™ brand inductively coupled plasma processing systems systems are available from, for example, Lam Research Corporation of Fremont, Calif.

Figure 4:
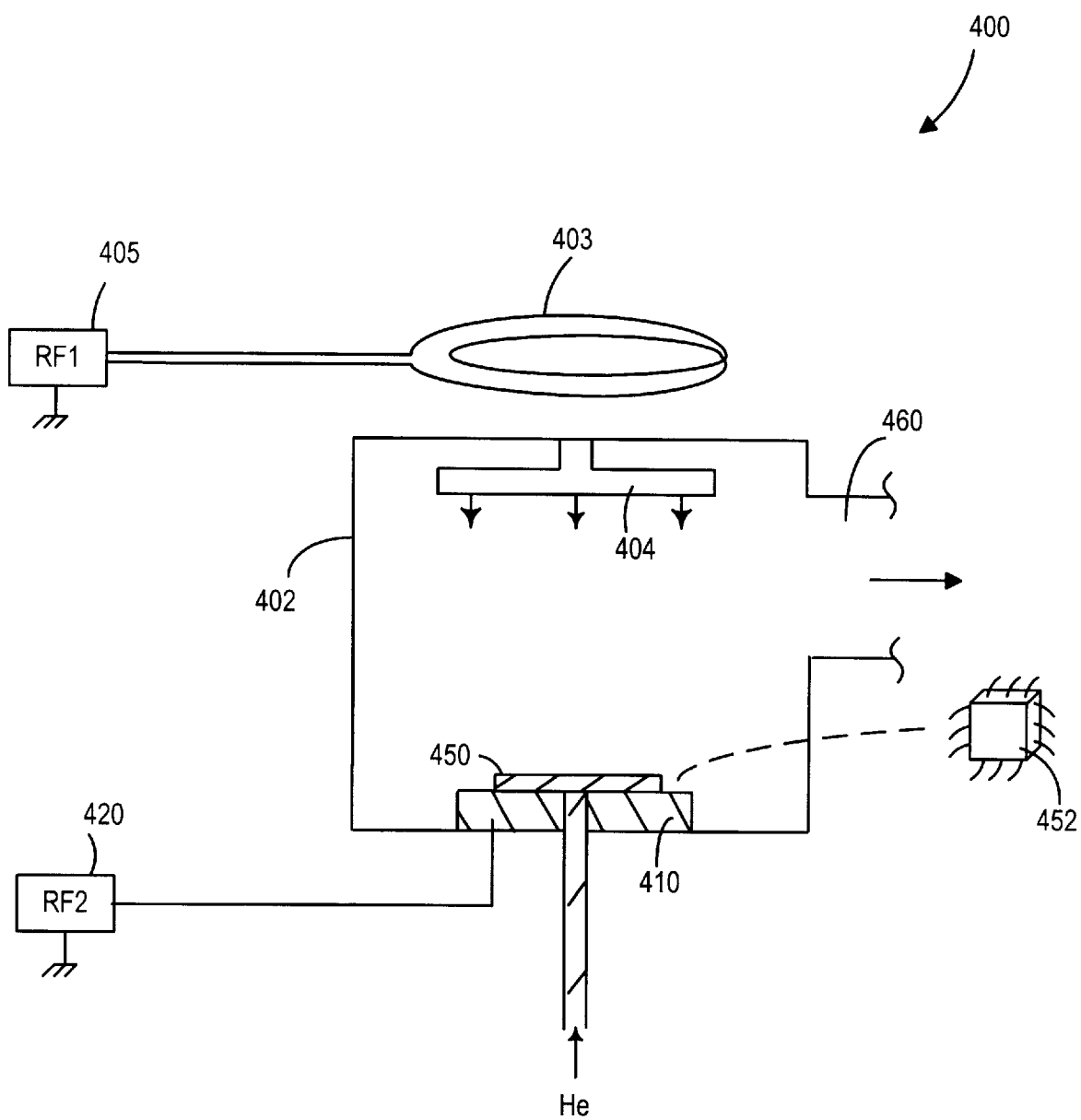
FIG. 4 illustrates a simplified schematic of the TCP™ 9600 SE plasma reactor, representing, in one embodiment of the present invention, a plasma processing system suitable for use with the inventive photoresist mask defect removal and/or organic-based ARC breakthrough etch.

In a preferred embodiment, the present invention is employed in a TCP™ 9600 SE plasma leactor, which is available from Lam Research Corporation, although, as mentioned above, any conventional and suitable plasma processing systems may well be employed. FIG. 4 illustrates a simplified schematic of the TCP™ 9600 SE plasma reactor, including substrate 450 and exemplary integrated circuit chips 452, which are fabricated from dies cut from substrate 450 after the substrate is etched according to the inventive etch and processed in conventional post-etch steps. It should be borne in mind that although IC wafers are employed herein as an example for ease of discussion, the inventive photoresist mask defect removal and/or organic-based ARC etch process may apply to the etching of any substrate, e.g., a flat display panel.

Referring to FIG. 4, a reactor 400 includes a plasma processing chamber 402. Above chamber 402, there is disposed an electrode 403, which is implemented by a coil in the example of FIG. 4. Coil 403 is energized by a RF generator 405 via a matching network (not shown in FIG. 4).

Within chamber 402, there is provided a shower head 404, which preferably includes a plurality of holes for releasing gaseous source materials, e.g., the etchant source gases, into the RF-induced plasma region between shower head 404 and substrate 450. The gaseous source materials may also be released from ports built into the walls of the chamber itself or from a gas ring (which may be annular) disposed in the chamber. Substrate 450 is introduced into chamber 402 and disposed on a chuck 410, which acts as a second electrode and is preferably biased by a radio frequency generator 420 (also typically via a matching network).

Helium cooling gas is introduced under pressure between chuck 410 and substrate 450 to act as a heat transfer medium for accurately controlling the substrate's temperature during processing to ensure uniform and repeatable etching results. During plasma etching, the pressure within chamber 402 may be regulated by withdrawing gas through port 460. A plurality of heaters (omitted from FIG. 4 to simplify the illustration) may be provided to maintain a suitable chamber temperature for etching. To provide an electrical path to ground, the chamber wall of chamber 402 may be grounded.

Figure 5:
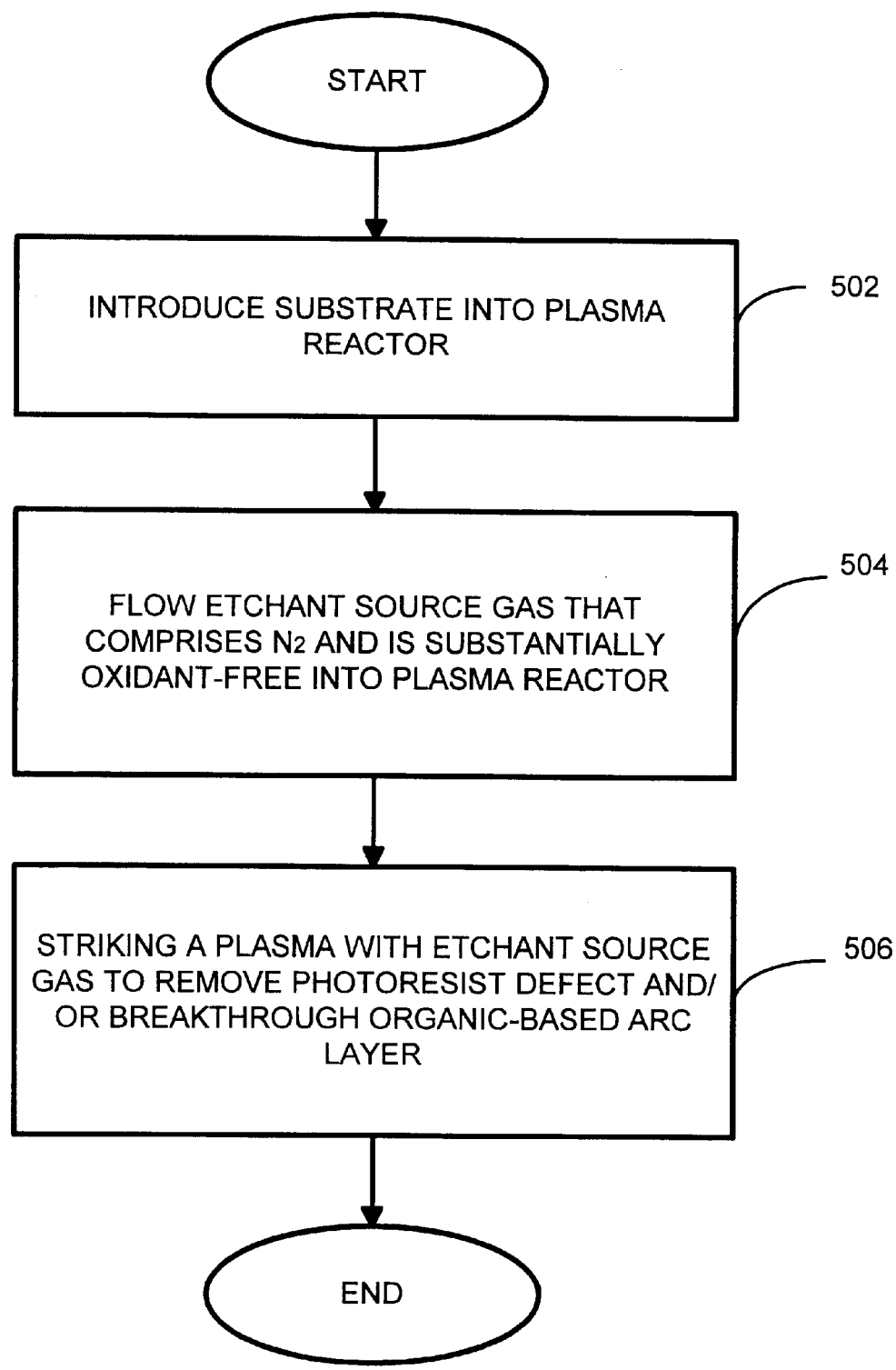
FIG. 5 illustrates, in accordance with one embodiment of the present invention, the steps involved in the inventive etch technique, which employs the $N_2$-based etchant source gas for removing photoresist mask defects and/or breaking through the organic-based ARC layer.

FIG. 5 illustrates, in accordance with one embodiment of the present invention, the steps involved in the inventive etch technique, which employs the $N_2$-based etchant source gas for removing photoresist mask defects and/or breaking through the organic-based ARC layer. In step 502, a substrate having thereon a photoresist mask is introduced into the plasma processing reactor. In step 504, an etchant source gas comprising $N_2$ is flowed into the plasma processing chamber. In one embodiment, the etchant source gas consists essentially of $N_2$. Preferably, the etchant source gas is substantially oxidant-free, i.e., substantially no $O_2$ is employed in the etchant source gas mixture.

In step 506, a plasma is struck with the $N_2$-based etchant source gas to remove photoresist mask defects and/or to perform breakthrough etch of the organic-based (e.g., polyamide-based) ARC layer. Step 506 is performed for a predefined duration in one embodiment. The predefined duration may be determined, for example, empirically to insure that substantially all photoresist mask defects can be removed. If the etch is employed to alternatively or additionally etch through the organic-based (e.g., polyamide-based) ARC layer, the predefined duration preferably takes into account the time required to etch the organic-based ARC layer.

In accordance with one aspect of the present invention, the same plasma processing chamber employed to perform the photoresist mask defect removal and/or the organic-based breakthrough etch is preferably employed in the main etch step. By way of example, a substrate may be introduced into a given plasma processing chamber for photoresist mask defect removal and/or the organic-based ARC layer breakthrough. Subsequently, the same plasma processing chamber is employed for etching through the underlying metallization layer, e.g., to form the conductive metal lines. The invention facilitates this since the $N_2$-based etching process generates fewer contaminant particles. Advantageously, there is no need to involve another plasma processing chamber, thereby minimizing the number of additional processing and/or substrate moving steps involved in obtaining a well-defined photoresist mask and/or to breakthrough the organic-based ARC layer.

In the following paragraphs, approximate ranges believed to be suitable for performing the inventive $N_2$ etching step for photoresist mask defect remedy and/or organic-based ARC layer breakthrough are disclosed. Although the suitable ranges are disclosed hereinbelow in connection with 200 mm wafers in a TCP™ 9600 SE™ plasma reactor. these ranges should serve as guidelines to enable one skilled in the art to adapt the disclosed etch technique to wafers having other dimensions and/or other plasma etch reactors.

For a 150 mm wafer processed in a TCP™ 9600 SE™ plasma processing reactor, the total flow of the etchant source gas, which includes $N_2$ and substantially no oxidant, is between about 20 standard cubic centimeters per minute (sccm) and about 200 sccm, more preferably between about 25 sccm and about 120 sccm, and preferably at about 60 sccm.

The Top electrode power may be between about 125 watts (W) and about 1,200 W, more preferably between about 150 W and about 700 W, and preferably at about 560 W. The power to the chuck electrode may be between about 125 watts (W) and about 800 W. more preferably between about 125 W and about 350 W, and preferably at about 140 W.

The pressure within the chamber interior, in milliTorr (mTorr), is between about 1 mT and about 80 mT, more preferably between about 6 mTorr and about 40 mT, and most preferably at about 15 mTorr. The bottom electrode temperature may be between about 0° C. and 80° C., more preferably between about 20° C. and 70° C., and preferably at about 30° C.

EXAMPLE

In a sample etch, a 200 mm wafer having thereon a deep UV (DUV) photoresist mask is introduced into a TCP™ 9600 SE™ plasma processing chamber. A scumming-type defect layer about 1,600 angstroms thick exists at the bottom of trenches, some of which having a width of about 0.35 to 0.40 micron and a height of about 1.2 microns. The etchant source gas employed to remove photoresist mask defects consists essentially of $N_2$. Substantially no oxidant (e.g., $O_2$) is employed in the removal of photoresist mask defects.

During the $N_2$ etching step to remove photoresist mask defects, the pressure in the chamber is about 15 milliTorr and the backside helium pressure is about 8 Torr. $N_2$ etchant source gas is flowed at about 60 standard cubic centimeters per minute (sccm). The top TCP electrode power is at about 560 watts (W), and the power to the bottom electrode is at about 140 W. The temperature of the bottom electrode on which the wafer is disposed is maintained at about 30° C. during the photoresist mask defect removal process. In this example, the etch rate through photoresist is found to be about 2,000 to about 2,400 angstroms per minute. The photoresist mask defect removal etching step is terminated after about 40 seconds. After termination, it is found that substantially all of the scumming layer photoresist material is removed.

It is believed that substantially similar parameters may be employed to perform the breakthrough etch of the underlying organic-based, e.g., polyamide-based, ARC layer prior to performing the main etch (e.g., the metal layer etch). It is contemplated that the same recipe, albeit with a longer duration, may be employed to both remedy photoresist mask defects and breakthrough etching of the organic-based, e.g., polyamide-based, ARC layer.

While this invention has been described in terms of several preferred embodiments, there are alterations, permutations, and equivalents which fall within the scope of this invention. For example, although the discussion is made herein with reference to conventional (e.g., Iline or deep UV) photoresist for ease of illustration, it is contemplated that the inventive technique applies equally well to photoresists which are dry. This type of photoresist mask, which may be employed in small geometry (e.g., below 0.18 microns in some cases) etches, may represent for example photoresist which have been coated with silicon dioxide (via a silation chamber for example) prior to having the protective photoresist features etched out for masking purposes. The inventive etch technique herein may be employed to address photoresist mask defects in dry photoresist masks as well. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

what is claimed is:

1. In a plasma reactor, a method for removing photoresist mask defects, comprising:

introducing a substrate having thereon a photoresist mask into said plasma reactor;

flowing into said plasma reactor an etchant source gas comprising nitrogen, said etchant source gas being substantially oxygen-free; and removing, prior to a subsequent etching operation, said photoresist mask defects resulting from incomplete removal of predetermined portions of said photoresist mask by employing a plasma struck with said etchant source gas.

2. In a plasma reactor, a method for removing photoresist mask defects, comprising:

introducing a substrate having thereon a photoresist mask into said plasma reactor, said photoresist mask includes at least a feature having a critical dimension below about 0.35 microns;

flowing into said plasma reactor an etchant source gas comprising nitrogen, said etchant source gas being substantially oxygen-free; and removing said photoresist mask defects employing a plasma struck with said etchant source gas, said photoresist mask defects represent one of scumming layer-type defects and sloped foot-type defects disposed toward a bottom of said feature.

3. In a plasma reactor, a method for removing photoresist mask defects, comprising:

introducing a substrate having thereon a photoresist mask into said plasma reactor, said photoresist mask includes at least a trench having a critical dimension below about 0.35 microns and an aspect ratio higher than about 3:1;

flowing into said plasma reactor an etchant source gas comprising nitrogen, said etchant source gas being substantially oxygen-free; and removing said photoresist mask defects employing a plasma struck with said etchant source gas, said photoresist mask defects represent one of scumming layer-type defects and sloped foot-type defects disposed toward a bottom of said trench.

4. In a plasma reactor, a method for removing photoresist mask defects, comprising:

introducing a substrate having thereon a photoresist mask into said plasma reactor, said substrate includes a polyamide-based layer underlying said photoresist mask;

flowing into said plasma reactor an etchant source gas comprising nitrogen, said etchant source gas being substantially oxygen-free;

removing said photoresist mask defects employing a plasma struck with said etchant source gas; and etching said polyamide-based layer with said plasma.

5. The method of claim 4 wherein said polyamide-based layer represents an antireflective coating layer.

6. The method of claim 2 wherein said removing is performed with a plasma reactor pressure of between about 1 milliTorr and about 80 milliTorr.

7. The method of claim 2 wherein said plasma reactor pressure is between about 6 milliTorr and about 40 milliTorr.

8. The method of claim 2 wherein said substrate is disposed on a chuck within said plasma reactor, said chuck being maintained at between about 0° C. and about 80° C. during said removing.

9. The method of claim 1 wherein said removing is performed with a plasma reactor pressure of between about 1 milliTorr and about 80 milliTorr, said substrate is disposed on a chuck within said plasma reactor, said chuck being maintained at between about 0° C. and about 80° C. during said removing.

10. The method of claim 9 wherein said plasma reactor represents an inductively coupled plasma processing reactor having a top electrode, said chuck representing a lower electrode of said plasma reactor, wherein said removing is performed while said top electrode is supplied with between about 150 watts to about 700 watts of power.

11. The method of claim 10 wherein said removing is performed while said lower electrode is supplied with between about 125 watts to about 350 watts of power.

12. The method of claim 1 wherein said substrate represents a substrate employed for manufacturing integrated circuits.

13. The method of claim 12 wherein said plasma reactor represents a reactor employed for a subsequent etching of a metallization layer disposed below said photoresist mask.

14. In a plasma reactor, a method for breaking through an organic-based antireflective coating layer, comprising:

introducing a substrate having thereon said organic-based antireflective coating layer and a photoresist mask disposed above said organic-based antireflective coating layer into said plasma reactor;

flowing into said plasma reactor an etchant source gas consisting essentially of nitrogen;

etching through a thickness of said organic-based antireflective coating layer employing a plasma struck with said etchant source gas, said etching being performed in areas substantially unprotected by said photoresist mask; and removing photoresist mask defects employing said plasma struck with said etchant source gas.

15. The method of claim 14 wherein substrate is employed in manufacture of circuits, said circuits being scaled with design rules below about 0.25 microns.

16. The method of claim 14 wherein said removing of said photoresist mask defects in said photoresist masks takes place prior to etching, said photoresist mask defects represent one of scumming layer-type defects and sloped foot-type defects.

17. The method of claim 14 wherein said etching is performed with a plasma reactor pressure of between about 1 milliTorr and about 80 milliTorr.

18. The method of claim 14 wherein said plasma reactor pressure is between about 6 milliTorr and about 40 mIlliTorr.

19. The method of claim 14 wherein said substrate is disposed on a chuck within said plasma reactor, said chuck being maintained at between about 0° C. and about 80° C. during said etching.

20. The method of claim 14 wherein said etching is performed with a plasma reactor pressure of between about 1 milliTorr and about 80 miiliTorr, said substrate is disposed on a chuck within said plasma reactor, said chuck being maintained at between about 0° C. and about 80° C. during said etching.

21. The method of claim 20 wherein said plasma reactor represents an inductively coupled plasma processing reactor having a top electrode, said chuck representing a lower electrode of said plasma reactor, wherein said etching is performed while said top electrode is supplied with between about 125 watts to about 1200 watts of power.

22. The method of claim 21 wherein said etching is performed when said lower electrode is supplied with between about 125 watts to about 800 watts of power.

23. The method of claim 14 wherein said substrate represents a substrate employed for manufacturing integrated circuits.

24. The method of claim 23 wherein said plasma reactor represents a reactor employed for a subsequent etching of a metallization layer disposed below said organic-based antireflective coating layer.

25. The method of claim 24 wherein said organic-based antireflective coating layer represents a polyamide-based organic antireflective coating layer.

26. The method of claim 14 wherein said etchant source gas is substantially oxygen-free.

27. In a plasma reactor, a method for performing a combined photoresist mask defect removal and breakthrough etching through a polyamide-based antireflective coating layer, comprising:

placing a substrate on a chuck in said plasma reactor, said substrate having thereon a photoresist mask and an underlying layer of polyamide-based antireflective coating layer;

flowing into said plasma reactor an etchant source gas comprising nitrogen and being substantially oxygen-free; and etching away both said photoresist mask defect and through said polyamide-based antireflective coating layer with a plasma struck from said etchant source gas.

28. The method of claim 27 wherein said plasma reactor represents a transformer-coupled plasma reactor.

29. The method of claim 28 wherein said plasma reactor represents a plasma reactor subsequently employed to etch a metallization layer disposed below said polyamide-based antireflective coating layer, thereby eliminating a need to etch said metailization layer in a different plasma reactor that is different from said plasma reactor.

30. The method of claim 29 wherein said substrate is employed in manufacturing integrated circuits.

* * * * *